United States Patent
Chen et al.

(10) Patent No.: US 10,784,400 B2
(45) Date of Patent: Sep. 22, 2020

(54) MASS TRANSFER METHOD FOR MICRO-LEDS WITH A TEMPERATURE-CONTROLLED ADHESIVE LAYER

(71) Applicant: Guangdong University of Technology, Guangzhou, Guangdong (CN)

(72) Inventors: Yun Chen, Guangzhou (CN); Dachuang Shi, Guangzhou (CN); Xin Chen, Guangzhou (CN); Qiang Liu, Guangzhou (CN); Jian Gao, Guangzhou (CN); Ching-Ping Wong, Atlanta, GA (US)

(73) Assignee: Guangdong University of Technology, Guangzhou (CN)

( * ) Notice: Subject to any disclaimer, the term of this patent is extended or adjusted under 35 U.S.C. 154(b) by 0 days.

(21) Appl. No.: 16/706,713

(22) Filed: Dec. 7, 2019

(65) Prior Publication Data

US 2020/0203558 A1   Jun. 25, 2020

(30) Foreign Application Priority Data

Dec. 20, 2018   (CN) .......................... 2018 1 1564858

(51) Int. Cl.
| | | |
|---|---|---|
| *H01L 33/00* | (2010.01) | |
| *H01L 21/683* | (2006.01) | |
| *H01L 23/00* | (2006.01) | |
| *H01L 33/62* | (2010.01) | |

(52) U.S. Cl.
CPC ...... *H01L 33/0093* (2020.05); *H01L 21/6835* (2013.01); *H01L 24/83* (2013.01); *H01L 33/62* (2013.01); *H01L 2221/68368* (2013.01); *H01L 2221/68381* (2013.01); *H01L 2224/83005* (2013.01); *H01L 2224/83085* (2013.01); *H01L 2224/8385* (2013.01); *H01L 2224/83097* (2013.01); *H01L 2933/0066* (2013.01)

(58) Field of Classification Search
CPC . H01L 33/0093; H01L 21/6835; H01L 24/83; H01L 33/62; H01L 2933/0066; H01L 2221/68368; H01L 2221/68381; H01L 2224/8385; H01L 2224/83097; H01L 2224/83005; H01L 2224/83085
See application file for complete search history.

(56) References Cited

FOREIGN PATENT DOCUMENTS

| CN | 106903978 A | 6/2017 |
| CN | 107425101 A | 12/2017 |
| CN | 107910413 A | 4/2018 |
| CN | 109661163 A | 4/2019 |

*Primary Examiner* — Stephen W Smoot
*Assistant Examiner* — Vicki B. Booker
(74) *Attorney, Agent, or Firm* — Wayne & Ken, LLC; Tony Hom

(57) ABSTRACT

A mass transfer method for Micro-LEDs with a temperature-controlled adhesive layer, including: configuring a self-assembling structure based on Micro-LED dies and a transfer substrate having a self-receiving structure coated on its surface with a temperature-controlled adhesive layer; distributing the Micro-LED dies in water, soaking the transfer substrate in water and heating water to perform self-assembling; carrying out transferring and removing the transfer substrate to separate Micro-LED dies from a transfer substrate then onto a target substrate.

5 Claims, 3 Drawing Sheets

MASS TRANSFER METHOD FOR MICRO-LEDS WITH A TEMPERATURE-CONTROLLED ADHESIVE LAYER

CROSS-REFERENCE TO RELATED APPLICATIONS

This application claims the benefit of priority from Chinese Patent Application No. 201811564858.5, filed on Dec. 20, 2018. The content of the aforementioned application, including any intervening amendments thereto, is incorporated herein by reference in its entirety.

TECHNICAL FIELD

The present invention relates to semiconductor photoelectric technologies, more particularly, to a mass transfer method for Micro-LEDs with a temperature-controlled adhesive layer.

BACKGROUND OF THE INVENTION

LED (light-emitting diode), a semiconductor electronic component that emits light, has the advantages of high energy conversion efficiency, short reaction time and long life span. Micro-LEDs (micro light-emitting diode) are obtained by thinning, miniaturizing and arraying conventional LEDs, and have a size of 1-10 μm. Due to the advantages of the LED display, Micro-LEDs are increasingly applied in displays, such as pico-projection of virtual reality devices, small-screen displaying of smart wearable devices, medium-screen displaying of televisions, large-screen displaying of outdoor displays, etc. However, applications of Micro-LEDs are limited by the manufacturing process of the Micro-LED display with an ultra-high resolution.

OLED (organic light-emitting diode) displays can be easily manufactured by inexpensive production methods such as printing to have a large light-emitting surface, and compared to the OLED, the Micro-LEDs are high in cost, since millions or tens of millions of micron-sized Micro-LED dies are required to be assembled and arrayed, i.e., mass transfer, so as to manufacture the Micro-LED display with a large size and high resolution. The mass transfer is to precisely pick up the micron-sized Micro-LED dies from the donor wafer, expand the distance of the arrays of dies and precisely mount the dies on the target substrate, such as display backplanes. The mounting of a television screen takes dozens of days according to the major die-bonding speed for LEDs in the prior art, which is far from meeting the needs of industrialization. Therefore, a new method is in great need to boost the industrialization of the Micro-LED displays by improving the picking speed and precision, expending the distance of the arrays of dies and mounting the dies more precisely.

In the prior art, magnetic transfer is the main technique used for stripping dies from the donor wafer, picking up and mounting the dies to the target substrate, such as the display backplanes. Unlike magnetic poles are respectively provided on the transfer substrate and the surface of the Micro-LED dies, and the Micro-LED dies are picked up by the transfer substrate, such that the mounting direction (positive and negative) of the Micro-LED dies is controlled. The picking up and releasing of the Micro-LED dies are flexible and are achieved by controlling the excitation current. However, the Micro-LED dies for certain applications may be damaged by the electromagnetic field, affecting the display quality.

Therefore, it is desirable to develop a new method which can achieve the self-assembling in a fluid environment by simply modifying the surface of the Micro-LED dies; and simultaneously, the Micro-LED dies are orderly picked during self-assembling.

SUMMARY OF THE INVENTION

Regarding to the mentioned drawbacks, the present invention provides a mass transfer method for Micro-LEDs with a temperature-controlled adhesive layer which adopts physical principles for transferring dies without affecting the dies, and the consumables of the present invention are reusable.

Therefore, the present invention provides the following technical solutions.

A mass transfer method for Micro-LEDs with a temperature-controlled adhesive layer, comprising:

a) configuration of a self-assembling structure providing an anode pin and a cathode pin on a side of Micro-LED dies; providing a self-assembling microstructure on the other side of the Micro-LED dies; providing a self-receiving microstructure on a transfer substrate; and coating a surface of the self-receiving microstructure with a temperature-controlled adhesive layer;

wherein the self-assembling microstructure and the self-receiving microstructure are fitted with each other; and the temperature-controlled adhesive layer is sticky at a temperature higher than 40° C. and loses a sticky property at a temperature below 25° C., and a switch of the sticky property of the temperature-controlled adhesive layer is reversible and repeatable;

b) self-assembling distributing the Micro-LED dies in a container with water; soaking the transfer substrate in the water to allow the temperature-controlled adhesive layer on the surface of the self-receiving microstructure of the transfer substrate to become sticky; and at the same time, stirring the water by a stirrer to allow the Micro-LED dies to fit with the self-receiving microstructure, where the Micro-LED dies are fixed to the self-receiving microstructure due to the temperature-controlled adhesive layer;

c) transferring stopping heating and stirring the water; taking out the transfer substrate; soaking a target substrate into the water; putting the transfer substrate into the water to align with the target substrate; and cooling the water to allow the temperature-controlled adhesive layer on the self-receiving microstructure of the transfer substrate to lose the sticky property, so that the Micro-LED dies are separated from the transfer substrate and transferred to the target substrate; and d) taking out the transfer substrate.

In some embodiments, the transfer substrate is applied to the Micro-LED dies having a geometrical size of 1-10 μm.

In some embodiments, the self-assembling microstructure and the self-receiving microstructure are of a stepped structure, and a height difference of two steps of the stepped structure is 1-10 μm.

In some embodiments, in the step A, the temperature-controlled adhesive layer is made of pHIPAM-CD and has a thickness of 10-100 μm.

Further, in the step B, after the heating, the water has a temperature of 40° C.; in the step C, after the heating the water has a temperature of 40° C., and after the cooling, the water has a temperature of 25° C.

Further, the transfer substrate is taken out by lifting with a directional movement speed of 1-10 mm/s.

The present invention has the following beneficial effects.

1. In the present invention, the Micro-LED dies can be orderly picked up by the self-receiving microstructure and the temperature-controlled adhesive layer, improving the efficiency of the mass transfer of the Micro-LEDs; the transfer substrate of the present invention is reusable and the whole process is simple and requires little manual operation; and the heating device is usually a heating stage, on which the container is placed and heated;

2. The stepped self-assembling microstructure has a slot-like structure, and by mounting with the dies of the same type, a die with a reversed anode and cathode cannot be attached to the self-receiving microstructure, such that the dies can be properly attached.

REFERENCE NUMERALS

102: container; 103: water; 104: transfer substrate; 106: Micro-LED die; 107: self-receiving microstructure; 201: anode pin; 202: cathode pin; 204: temperature-controlled adhesive layer; 304: target substrate; 305: heating stage.

DETAILED DESCRIPTION OF EMBODIMENTS

The technical solution of the present invention will be further described below with reference to the accompanying drawings and embodiments.

Figure 1:
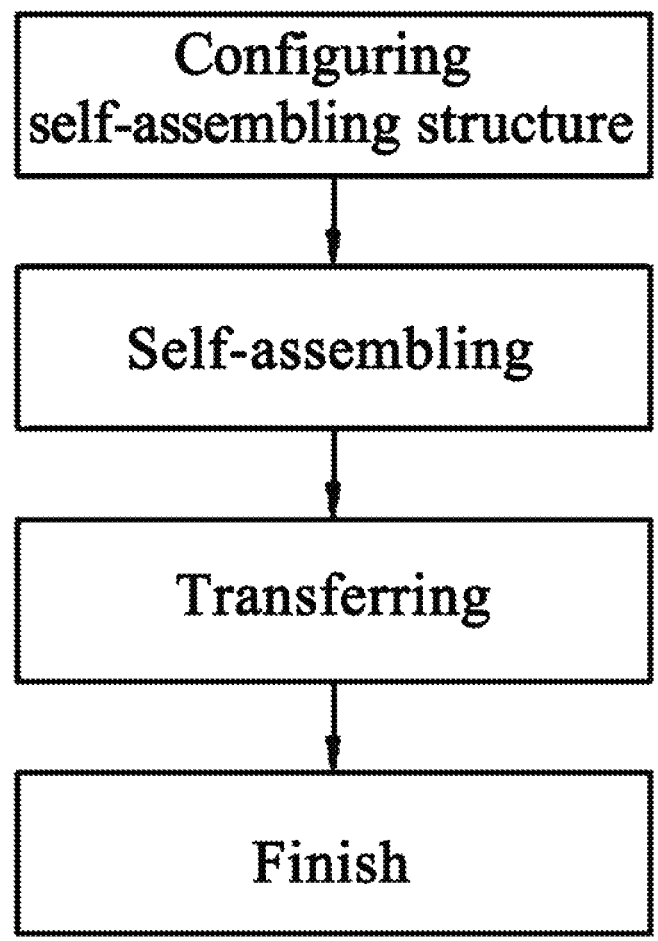
FIG. 1 is a flow chart of a mass transfer method for Micro-LEDs with temperature-controlled adhesive layer according to an embodiment of the present invention.
Figure 2:
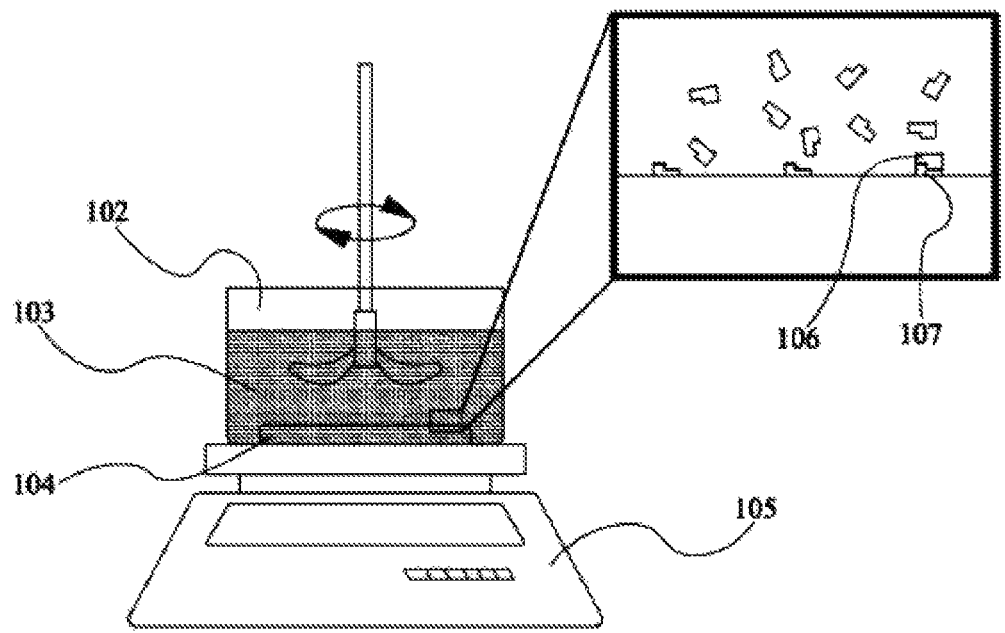
FIG. 2 is a schematic diagram showing a picking process of the mass transfer method for Micro-LEDs according to an embodiment of the present invention.
Figure 3:
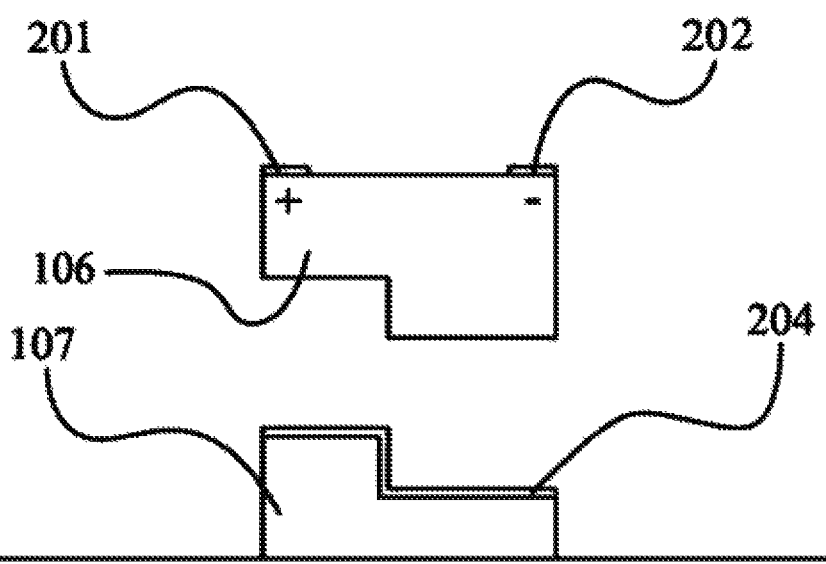
FIG. 3 is an enlarged view showing a Micro-LED die and a self-receiving microstructure according to an embodiment of the present invention.
Figure 4:
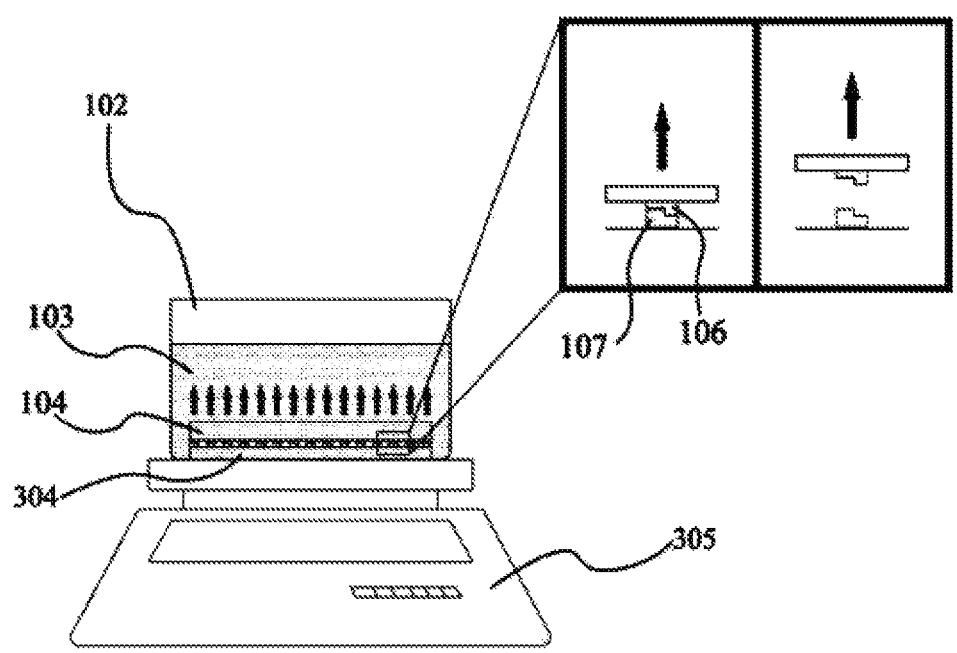
FIG. 4 is a schematic diagram showing the releasing process in the mass transfer method for Micro-LEDs according to an embodiment of the present invention.

As shown in FIGS. 1-4, illustrated is a mass transfer method for Micro-LEDs with temperature-controlled adhesive layer, comprising:

A) configuration of a self-assembling structure an anode pin 201 and a cathode pin 202 are provided on a side of Micro-LED dies 106, and a self-assembling microstructure is provided on the other side of the Micro-LED dies 106; a self-receiving microstructure 107 is provided on a transfer substrate 104; the self-assembling microstructure and the self-receiving microstructure are fitted with each other; and a temperature-controlled adhesive layer 204 is coated on the surface of the self-receiving microstructure, and is sticky at a temperature higher than 40° C. and loses the sticky property at a temperature below 25° C., and the switch of the sticky property of the temperature-controlled adhesive layer is reversible and repeatable;

B) self-assembling water 103 is filled in a container 102, in which the Micro-LED dies are distributed; the transfer substrate 104 is soaked in the water; the water is heated by a heating device, such that the temperature-controlled adhesive layer 204 on the surface of the self-receiving microstructure 107 becomes sticky; at the same time, the water is stirred by a stirrer to allow the Micro-LED dies 106 to fit with the self-receiving microstructure 107, and since the temperature-controlled adhesive layer 204 is sticky, the Micro-LED dies 106 are fixed to the self-receiving microstructure 107;

C) transferring the transfer substrate 104 is taken out from the water after the heating and stirring for the water are stopped; a target substrate 304 is soaked in high-temperature water; the transfer substrate 104 is then put into the high-temperature water to align with the target substrate 304; and the temperature-controlled adhesive layer 204 on the surface of the self-receiving microstructure 107 of the transfer substrate 104 loses the sticky property by cooling the water, such that the Micro-LED dies 106 separate from the transfer substrate 104 and are transferred to the target substrate 304;

D) the transfer substrate 104 is taken out after the transferring.

In the present invention, the Micro-LED dies 106 can be orderly picked up by the self-receiving microstructure 107 and the temperature-controlled adhesive layer 204, improving the efficiency of the mass transfer of the Micro-LEDs; the transfer substrate 104 of the present invention is reusable and the whole process is simple and requires little manual operation; and the heating device is usually a heating stage 305, on which the container is placed and heated.

The transfer substrate 104 is applied to the Micro-LED dies 106 having a geometrical size of 1-10 μm, which means the transfer substrate 104 is suitable for all existing Micro-LED dies.

The self-assembling microstructure and the self-receiving microstructure 107 both are of a stepped structure, and a height difference of two steps of the stepped structure is 1-10 μm.

The stepped self-assembling microstructure has a slot-like structure, and by mounting with the dies of the same type, a die with a reversed anode and cathode cannot be attached to the self-receiving microstructure 107, such that the dies can be properly attached.

In addition, the temperature-controlled adhesive layer 204 in the step A is made of pHIPAM-CD and has a thickness of 10-100 μm. The pHIPAM-CD is an existing adhesive material that has different stickiness at different temperatures. The pHIPAM-CD may have or lose the sticky property under different temperatures.

In addition, in step B, after the heating, the water has a temperature of 40° C.; in step C, after the heating, the water has a temperature of 40° C., and after the cooling, the water has a temperature of 25° C.

In step D, the transfer substrate 104 is taken out by lifting with a directional movement speed of 1-10 mm/s.

The speed of the water flow ensures that the Micro-LED dies 106 are reliably attached to the self-receiving microstructure 107. A die, if not reliably attached, may be separated from the self-receiving microstructure 107 by the water, and finally the die is repeated to be reattached to the self-receiving microstructure 107.

The present invention has been described above in conjunction with the embodiment. The descriptions are merely illustrative of the spirit of the present invention and are not intended to limit the scope of the present invention. Any embodiments obtained by those skilled in the art based on the invention without any creative work shall fall within the scope of the invention.

We claim:

1. A mass transfer method for Micro-LEDs with a temperature-controlled adhesive layer, comprising:

a) configuration of a self-assembling structure by providing an anode pin and a cathode pin on a side of Micro-LED dies; providing a self-assembling microstructure on the other side of the Micro-LED dies; providing a self-receiving microstructure on a transfer substrate; and coating a surface of the self-receiving microstructure with a temperature-controlled adhesive layer;

wherein the self-assembling microstructure and the self-receiving microstructure are fitted with each other; and the temperature-controlled adhesive layer is sticky at a temperature higher than 40° C. and loses a sticky property at a temperature below 25° C., and a switch of the sticky property of the temperature-controlled adhesive layer is reversible and repeatable;

b) self-assembling by distributing the Micro-LED dies in a container with water; soaking the transfer substrate in the water to allow the temperature-controlled adhesive layer on the surface of the self-receiving microstructure of the transfer substrate to become sticky; and at the same time, stirring, by a stirrer, the water to allow the Micro-LED dies to fit with the self-receiving microstructure, wherein the Micro-LED dies are fixed to the self-receiving microstructure due to the temperature-controlled adhesive layer;

c) transferring by stopping heating and stirring the water; taking out the transfer substrate; soaking a target substrate into the water; putting the transfer substrate into the water to align with the target substrate; and cooling the water to allow the temperature-controlled adhesive layer on the self-receiving microstructure of the transfer substrate to lose the sticky property, so that the Micro-LED dies are separated from the transfer substrate and transferred to the target substrate; and d) taking out the transfer substrate;

wherein the transfer substrate is applied to the Micro-LED dies having a geometrical size of 1-10 μm.

2. The mass transfer method of claim 1, wherein the self-assembling microstructure and the self-receiving microstructure are of a stepped structure, and a height difference of two steps of the stepped structure is 1-10 μm.

3. The mass transfer method of claim 1, wherein in step a), the temperature-controlled adhesive layer is made of pHIPAM-CD and has a thickness of 10-100 μm.

4. The mass transfer method of claim 1, wherein in step b), after the heating, the water has a temperature of 40° C.; in step c), after the heating, the water has a temperature of 40° C., and after the cooling, the water has a temperature of 25° C.

5. The mass transfer method of claim 1, wherein the transfer substrate is taken out by lifting at a directional movement speed of 1-10 mm/s.

* * * * *